United States Patent [19]

Hanlon et al.

[11] 4,030,793
[45] June 21, 1977

[54] ELECTRONIC PROGRAMING JUMPER PINS AND DUAL-IN-LINE ASSEMBLY THEREOF

[75] Inventors: Richard J. Hanlon, Attleboro, Mass.; Neil F. Damon, Manville; Herbert G. Yeo, Lincoln, both of R.I.

[73] Assignee: Augat, Inc., Attleboro, Mass.

[22] Filed: June 30, 1975

[21] Appl. No.: 591,438

[52] U.S. Cl. .............................. 339/19; 339/18 C
[51] Int. Cl.² ........................................ H01R 31/08
[58] Field of Search ............ 339/18 C, 19, 38, 222

[56] References Cited

UNITED STATES PATENTS

| | | | |
|---|---|---|---|
| 3,054,078 | 9/1962 | Baschkin | 339/19 |
| 3,680,032 | 7/1972 | Mosier | 339/17 F |
| 3,701,964 | 10/1972 | Cronin | 339/18 C |
| 3,731,254 | 5/1973 | Key | 339/19 |
| 3,905,667 | 9/1975 | Crimmins | 339/19 |

*Primary Examiner*—Roy Lake
*Assistant Examiner*—Mark S. Bicks

*Attorney, Agent, or Firm*—Weingarten, Maxham & Schurgin

[57] ABSTRACT

A dual-in-line programming jumper pin assembly for use with electrical panel boards having dual-in-line arrays of holes therethrough. Jumper pins may be mounted as desired in slots in an insulator having a shape and size similar to the body of a dual-in-line electronic package, for purposes of electrically interconnecting two or more socket contacts mounted in a panel board. Such jumper pins having different configurations may interconnect, among others: two or more adjacent socket contacts in a line; two socket contacts on opposite sides of an array; two adjacent socket contacts with a third on the opposite side of the array; and two adjacent socket contacts with two other adjacent ones on the opposite side of the array. Means are provided on each jumper pin to anchor it firmly within the slots in the insulator. The jumper pins may be employed for interconnecting two or more socket contacts independently of the insulator.

15 Claims, 8 Drawing Figures

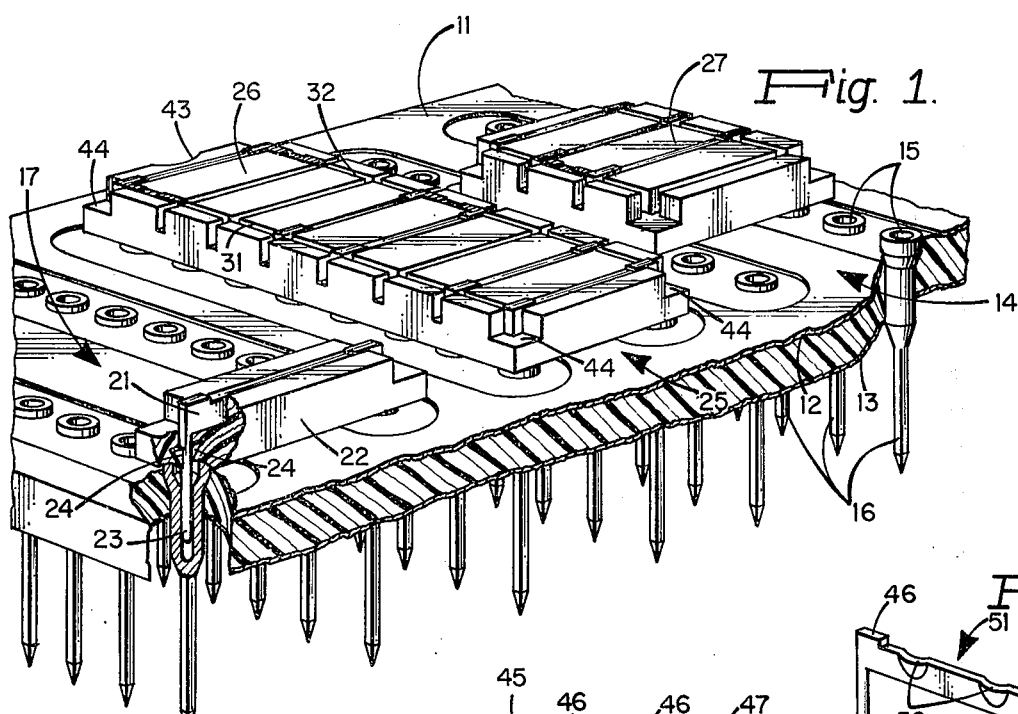
Fig. 1.
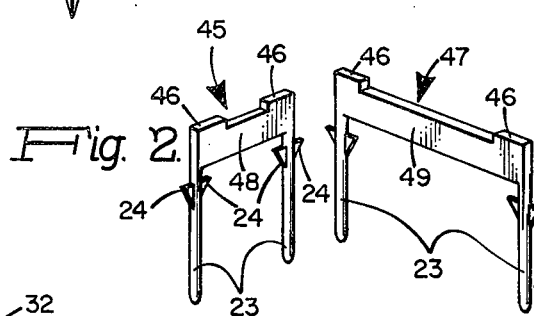
Fig. 2. Fig. 3. Fig. 4.
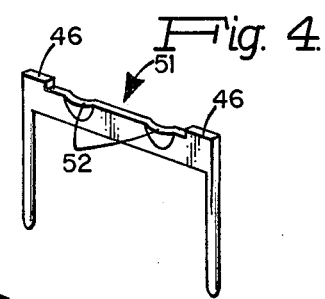
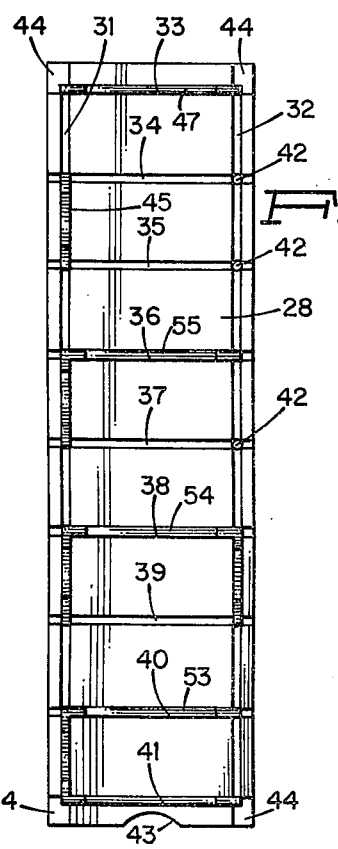
Fig. 8.
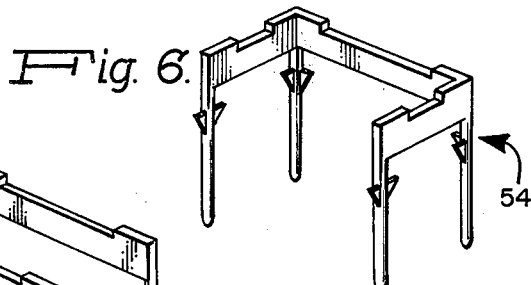
Fig. 6.
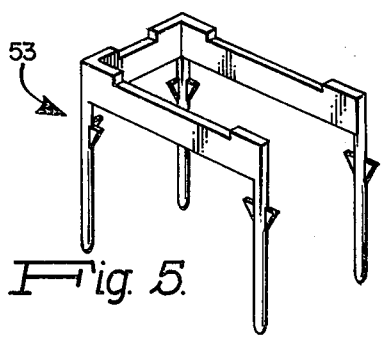
Fig. 5.
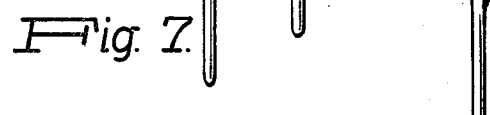
Fig. 7.

ELECTRONIC PROGRAMING JUMPER PINS AND DUAL-IN-LINE ASSEMBLY THEREOF

FIELD OF THE INVENTION

This invention relates generally to interconnecting elements used with electronic panel boards and more particularly concerns manually programmable jumper pins for electrically interconnecting socket contacts in panel board dual-in-line arrays.

DISCUSSION OF THE PRIOR ART

Printed circuit boards and panel boards used in the electronic industry often include dual-in-line arrays of holes in the board. Where pins, often socket contacts are employed, wires are typically soldered thereto for purposes of electrical interconnection. Additionally, leads of discrete electronic components thereto may be soldered to such contacts, or they may be configured with wire wrapping pins for conventional wire wrapping interconnections. Such pins normally have a socket on the side of the board opposite the pin projection, into which socket leads of integrated circuits and other dual-in-line electronic packages and components may be plugged. It has previously been the practice to electrically interconnect two or more of these socket contacts in an array by means of soldering or wire wrapping interconnecting wires between desired ones of such pins or between the sockets on the side of the board opposite the pins. Another prior art interconnecting means is a single element jumper pin which extends individually between two opposite socket contacts of an array. These holes may be bare, plated through or have socket pins inserted in them as is appropriate for their final use. However, it is often desirable to interconnect two or more such holes electrically, thus interconnecting the circuit traces associated with those holes.

SUMMARY OF THE INVENTION

This invention provides a simplified means for a panel board user to program the panel board holes and socket contacts arranged in dual-in-line arrays. This is accomplished by interconnecting two or more such socket contacts of the panel board, employing a programming jumper pin which may be arranged in an assembly having the conventional dual-in-line configuration. An insulator of such an assembly has a configuration similar to the body of an integrated circuit package and is formed with two parallel longitudinal slots along one flat side adjacent the opposite edges, and a plurality of intersecting transverse slots in the same flat side, the intersections having the conventional dual-in-line lead spacing. The slots extend to a depth of approximately one-half the thickness of the insulator and holes extend through the insulator at each intersection of a transverse slot with a longitudinal slot. Jumper pins having various configurations, such as linear, L-shaped and U-shaped, may be inserted into the slots with their contacts extending through the holes to thereby provide a device having the appearance of a conventional dual-in-line modular package. The pins are retained in the insulator by means of detents on the upper cross bar or fish hook type barbs on the contacts themselves.

In many bread boarding situations, the insulator will not be used as the jumper pins plug directly into the holes or sockets in the board as desired.

BRIEF DESCRIPTION OF THE DRAWING

The advantages, objects and features of this invention will be more clearly understood from the detailed specification when read in conjunction with the accompanied drawing in which:

FIG. 1 is a perspective view of a portion of a panel board having programming jumper pin assemblies constructed in accordance with this invention mounted thereto;

FIG. 2 shows a jumper pin for connecting two adjacent socket contacts;

FIG. 3 shows a jumper pin for connecting two socket contacts on opposite sides of an array;

FIG. 4 shows an alternative embodiment of the jumper pin of FIG. 3;

FIG. 5 shows a U-shaped configuration of a jumper pin for connecting two adjacent socket contacts with two adjacent socket contacts on the opposite side of an array;

FIG. 6 shows an alternative embodiment of U-shaped configuration interconnecting two adjacent socket contacts with two adjacent socket contacts on the opposite side of an array;

FIG. 7 shows an L-shaped jumper pin for interconnecting two adjacent and one opposite socket contact; and FIG. 8 is a top view of the jumper pin assembly incorporating various of the jumper pin configurations shown in FIGS. 2-7.

DETAILED DESCRIPTION OF THE PREFERRED EMBODIMENT

With reference now to the drawing, there is shown in FIG. 1 a conventional panel board 11 having an upper conductive foil surface 12 and a lower conductive foil surface 13 with dual-in-line arrays of holes such as arrays 14, 17 and 25, having a socket contact 15 mounted in each of holes 14. The socket contacts are shown in the drawing with a wire wrapping configuration, that is, the elongated square projections 16 being configured for wire wrapping interconnections on the side of board 11 opposite the socket openings. However, the socket contacts may be any standard type or, of course, the holes in the arrays need not have any socket contacts but could be plain drilled holes or plated-through holes. Furthermore, the panel board could be a multi-layer board, that is, a board having more than two conductive foil layers if desired. As used herein, "holes" will be used to designate socket contacts, plain holes and plated through holes.

Mounted to dual-in-line array 17 is a single jumper pin 21 held in place by an insulator 22 of single modular dimensions. One contact 23 of jumper pin 21 is shown projecting into a socket contact 15 and is anchored in insulator 22 by means of hook-like barbs 24. These barbs are shown more clearly in FIGS. 2, 3, 5, 6 and 7. Jumper pin 21 interconnects two socket contacts on opposite sides of array 17.

In dual-in-line array 25 is a full sixteen pin size insulator 26 having several different jumper pins mounted therein for interconnecting and programming the holes of that array. Finally, in array 14 is a shortened insulator 27, approximately half the size of insulator 26 which is used to program several of the holes in that array by means of one or more jumper pin configurations.

With reference now to FIG. 8, it may be seen that eighteen pin insulator 28 is formed with two parallel spaced longitudinal slots 31 and 32 on one flat side of the insulator adjacent the long edges thereof. The same flat side of the insulator is formed with a plurality, in this case nine, of transverse slots 33–41 intersecting the longitudinal slots. Both sets of slots have a depth of approximately one-half the thickness of the insulator. Dual-in-line packages normally have fourteen and sixteen pins but insulator 28 in FIG. 8 has been made slightly larger in order to clearly show one of each of the different jumper pins depicted in FIGS. 2, 3 and 5–7 mounted in a single insulator. At each intersection of a longitudinal slot with a transverse slot, a hole 42 is drilled through the insulator to receive individual contacts 23 of jumper pins which pass through the insulator for inserting into a socket contact in the panel board. Note that insulators 26 and 28 have a polarity cut-out 43 for use in orienting the preprogrammed insulator with respect to an array of holes in the panel board. Furthermore, the upper part of each corner 44 of the insulators has been removed externally of the corner slot intersections. This is for practical manufacturing purposes since, after the slots are cut, the small amount of material remaining at the corners would be relatively fragile and subject to being snapped off and possibly causing electrical problems within an assembly.

The slots in the insulator are so oriented with respect to holes 42 therethrough as to insure that jumper pin contacts 23 are truly perpendicular to the bottom surface of the insulator. This is necessary so that the contacts of the pins will accurately line up with the holes in the panel board.

In FIGS. 2–7 there are shown several embodiments of the jumper pins of this invention, each of which has the basic configuration of a staple, some more complex than others. FIG. 2 shows the short, two-contact jumper pin 45 having contacts 23 depending in parallel from either end of cross bar 48. This jumper pin is configured with fish hook barbs 24 projecting from each contact 23 for anchoring in an insulator of the type previously described, and as shown in FIG. 1, jumper pin 21. This short jumper pin is formed to electrically interconnect two adjacent socket contacts in one line of an array. For example, one of jumper pins 45 is shown in longitudinal slot 31 in FIG. 8 interconnecting the pins beneath the intersections of this longitudinal slot with transverse slots 34 and 35. Top shoulders 46 of the jumper pins provide bearing surfaces for a tool to press the jumper pins downwardly into its slot where, because of barbs 24, an interference fit exists. By pushing down upon these shoulders, there is no danger that the jumper pin could be bent, sprung or broken. The distance between contacts 23 of jumper pin 45 is the conventional modular spacing of dual-in-line packages, that is, 0.100 inch (2.54 mm). A short insulator similar to single insulator 22 in FIG. 1 may be used to accommodate short jumper pin 45 if desired.

Long jumper pin 47 is shown in FIG. 3 and in transverse slot 33 in the insulator in FIG. 8. With contacts 23 depending in parallel from cross bar 49, this jumper pin interconnects two opposite holes 42 on opposite sides of an array. It is mounted to the insulator in the same manner as is jumper pin 45 of FIG. 2. An alternative embodiment of jumper pin 47 is shown in FIG. 4 wherein jumper pin 51 is formed with detents 52 which tend to bite into the material of the insulator just below the top of the transverse slot in which it is inserted. This is an anchoring means which is an alternative to the barbs 24 previously discussed and may be used on any of the jumper pin configurations.

A long U-shaped jumper pin 53 is shown in FIG. 5 and in transverse slots 40 and 41 of insulator 28 of FIG. 8, with the short cross bar occupying that portion of longitudinal slot 31 between these two transverse slots. This jumper pin interconnects two opposite pairs of socket contacts and is mounted in the insulator in the same manner as previously discussed.

FIG. 6 shows short U-shaped jumper pin 54 which is also shown in the FIG. 8 insulator interconnecting two opposite pairs of socket contacts with the long cross bar of the jumper pin residing in transverse slot 38 and having short cross bars mounted in longitudinal slots 31 and 32 between transverse slots 38 and 39.

L-shaped jumper pin 55 is shown in FIG. 7 with the long cross bar residing in transverse slot 36 of the insulator in FIG. 8 while the short cross bar of this jumper pin is in longitudinal slot 31 between slots 36 and 37. Of course, the L-shape may be either left or right oriented.

It may thus be seen that the user who wishes to program some of the contact holes or socket contacts in dual-in-line arrays of a panel board may do so by having available a supply of insulators such as 22, 26 and 27, and a supply of jumper pins 45, 47, 53, 54 and 55. The distance between contacts 23 projecting from the long cross bar of each of the jumper pins is 0.300 inch (7.62 mm) and the distance between contacts 23 projecting from the short cross bar of each jumper pin is 0.100 inch (2.54 mm), all in accordance with the standard spacing between lines of a dual-in-line array, and between pins in a line. The width of single insulator 22 is 0.100 inch (2.54 mm) so that any number of these may be used to individually program portions of an array without interferring with one another. While any suitable materials may be used, a typical material for the insulator is glass filled thermoplastic, and the jumper pin is typically phosphor bronze, gold over nickel plated.

In many situations a user will plug jumper pins directly into a board, much like a staple, without employing an insulator. This pluggable approach permits the greatest amount of flexibility in using the jumper pins. When a design is set, the jumper pins may be wave soldered to the board, either with or without the insulator.

In view of the above description, it is likely that those skilled in the art will be able to devise modifications and improvements which are within the scope of this invention. More complex jumper pins may be formulated which are combinations of the basic shapes shown in the accompanying drawing. A row of contacts on a cross bar having the spacing of jumper pin 45 could be used to interconnect several socket contacts in a line.

We claim:

1. A programming jumper pin assembly for electrically interconnecting selected holes in a dual-in-line array of holes in a substantially flat electrical printed circuit panel board, said assembly comprising:

an insulator of generally flat, rectangular configuration having a pair of spaced parallel longitudinal slots cut into one flat side thereof adjacent the longitudinal edges of said insulator, said longitudinal slots extending substantially the full length of said insulator, a plurality of spaced parallel transverse slots cut into said flat side, each said transverse slot being normal to and intersecting both of said longitudinal slots, said longitudinal and transverse slots being of substantially the same width, and a hole through said insulator at each intersection of one of said longitudinal slots with one of said transverse slots; and an electrically conductive jumper pin having at least two elongated spaced parallel contacts interconnected at respective one ends thereof by a cross bar, said cross bar residing in one of said longitudinal and transverse slots in said insulator, the other ends of said contacts projecting through said holes in said insulator and being adapted to enter and electrically interconnect at least two holes in said dual-in-line array of holes in said panel board.

2. The jumper pin assembly recited in claim 1 and further comprising means for firmly anchoring said jumper pin in said insulator.

3. The jumper pin assembly recited in claim 2 wherein said means for anchoring comprises a barb projecting from the surfaces of said jumper pin contacts adjacent the end of said contacts adjoining said cross bar, thereby forming an interference fit within said holes through said insulator.

4. The jumper pin assembly recited in claim 2 wherein said means for anchoring comprises at least one detent protruding from one edge of said cross bar, thereby forming an interference fit within said slots in said insulator.

5. The jumper pin assembly recited in claim 1 wherein said longitudinal and transverse slots in said insulator have a depth of approximately one-half the thickness of said insulator.

6. The jumper pin assembly recited in claim 1 wherein said transverse slots extend the full width of said insulator.

7. The jumper pin assembly recited in claim 1 and further comprising a plurality of jumper pins having cross bars mounted in selected ones of said slots in said insulator, at least one of said jumper pins interconnecting adjacent holes in a line of said array and at least one of said jumper pins interconnecting holes of said array opposite one another across said array.

8. The jumper pin assembly recited in claim 7 wherein said plurality of jumper pins includes an L-shaped cross bar configuration having three contacts projecting in spaced parallel relationship therefrom, one contact at each end and one contact at the apex of said cross bar.

9. The jumper pin assembly recited in claim 7 wherein said plurality of jumper pins includes a U-shaped cross bar configuration having square corners and having four contacts projecting in spaced parallel relationship therefrom, one contact from each end and one contact from each apex of said cross bar.

10. The jumper pin assembly recited in claim 1 wherein said slots in said insulator are so oriented with respect to said holes therethrough that said jumper pin contacts project through said insulator perpendicular to the bottom surface of said insulator.

11. The jumper pin assembly recited in claim 1 wherein the depth of each of said slots is at least as great as the height of said cross bar of said jumper pin.

12. An insulator for a programming jumper pin assembly adapted to retain a plurality of substantially staple-shaped jumper pins having elongated spaced parallel contacts extending from a cross bar, said insulator having a dual-in-line configuration for electrically interconnecting selected holes in a dual-in-line array of holes in a substantially flat electrical printed circuit panel board, said insulator comprising:

a generally flat, rectangular block of insulating material having a pair of spaced parallel longitudinal slots cut into one flat side thereof adjacent the longitudinal edges of said insulator, said longitudinal slots extending substantially the full length of said insulating block, a plurality of spaced parallel transverse slots cut into said flat side, each said transverse slot being normal to and intersecting both of said longitudinal slots, said longitudinal and transverse slots being of substantially the same width, and holes through said insulator at each intersection of one of said longitudinal slots with one of said transverse slots, said jumper pin contacts projecting through said holes in said insulator and being adapted to enter and electrically interconnect at least two holes in said dual-in-line array of holes in said panel board.

13. The insulator recited in claim 12 wherein said longitudinal and transverse slots in said insulator have a depth of approximately one-half the thickness of said insulator.

14. The insulator recited in claim 12 wherein said transverse slots extend the full width of said insulator.

15. A programming jumper pin assembly kit capable of being assembled in the field to electrically interconnect selected holes in a dual-in-line array of holes in a substantially flat electrical printed circuit panel board, said programming jumper pin assembly kit comprising:

a plurality of insulators, each of generally flat, rectangular configuration having a pair of spaced parallel longitudinal slots cut into one flat side thereof adjacent the longitudinal edges of said insulator, a plurality of spaced parallel transverse slots cut into said flat side, each said transverse slot being normal to and intersecting both of said longitudinal slots, said longitudinal and transverse slots being of substantially the same width, and a hole through said insulator at each intersection of one of said longitudinal slots with one of said transverse slots; and a plurality of staple-like jumper pins, including:
at least one first jumper pin having a staple-like configuration with two contacts projecting in spaced parallel relationship from the ends of a straight cross bar, each said contact being connected to said cross bar at respective one ends of said contacts, said cross bar being adapted to reside in one of said longitudinal slots in said insulator with said contacts projecting through two of said holes in said insulator to interconnect two adjacent holes in a line of said array in said panel board;

at least one second jumper pin having a staple-like configuration with two contacts projecting in spaced parallel relationship from the ends of a straight cross bar, each said contact being connected to said cross bar at respective one ends of said contacts, said cross bar being adapted to reside in one of said transverse and said longitudinal slots in said insulator with said contacts projecting through two of said holes in said insulator to selectively interconnect two holes opposite one another across said array and two nonadjacent holes in a line of said array in said panel board;

at least one third jumper pin having an L-shaped cross bar with three contacts projecting in spaced parallel relationship therefrom, one contact at each end and one contact at the apex of said cross bar, each said contact being connected to said cross bar at respective one ends of said contacts, one portion of said cross bar being adapted to reside in one of said longitudinal slots and another portion of said cross bar being adapted to reside in one of said transverse slots in said insulator with said contacts projecting through three of said holes in said insulator to interconnect two adjacent holes in a line of said array together with a third hole on the opposite side of said array from one of said two adjacent holes;

at least one fourth jumper pin having a U-shaped cross bar with four contacts projecting in spaced parallel relationship therefrom, one contact at each end and one contact at each apex of said cross bar, each said contact being connected to said cross bar at respective one ends of said contacts, two portions of said cross bar being adapted to reside in two adjacent ones of said transverse slots and another portion of said cross bar being adapted to reside in one of said longitudinal slots in said insulator with said contacts projecting through four of said holes in said insulator to interconnect two adjacent holes on one side of said array with two adjacent holes on the opposite side of said array; and at least one fifth jumper pin having a U-shaped cross bar with four contacts projecting in spaced parallel relationship therefrom, one contact at each end and one contact at each apex of said cross bar, each said contact being connected to said cross bar at respective one ends of said contacts, two portions of said cross bar being adapted to reside in the two longitudinal slots and another portion of said cross bar being adapted to reside in one of said transverse slots in said insulator with said contacts projecting through four of said holes in said insulator to interconnect two adjacent holes on one side of said array with two adjacent holes on the opposite side of said array.

* * * * *